United States Patent
Shim et al.

(10) Patent No.: US 9,178,048 B2
(45) Date of Patent: Nov. 3, 2015

(54) THIN FILM TRANSISTOR SUBSTRATE AND METHOD FOR MANUFACTURING THE SAME AND ORGANIC LIGHT EMITTING DEVICE USING THE SAME

(71) Applicant: LG Display Co., Ltd., Seoul (KR)

(72) Inventors: Jong Sik Shim, Seoul (KR); Woo Jin Nam, Goyang-si (KR); Hong Jae Shin, Seoul (KR); Min Kyu Chang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/546,912

(22) Filed: Nov. 18, 2014

(65) Prior Publication Data

US 2015/0072483 A1 Mar. 12, 2015

Related U.S. Application Data

(62) Division of application No. 13/685,572, filed on Nov. 26, 2012, now Pat. No. 8,916,915.

(30) Foreign Application Priority Data

Aug. 13, 2012 (KR) .......... 10-2012-0088565

(51) Int. Cl.
*H01L 21/00* (2006.01)
*H01L 29/66* (2006.01)
(Continued)

(52) U.S. Cl.
CPC .... *H01L 29/66969* (2013.01); *H01L 29/41733* (2013.01); *H01L 29/66742* (2013.01); *H01L 29/786* (2013.01); *H01L 29/7869* (2013.01); *H01L 29/78633* (2013.01); *H01L 29/78648* (2013.01); *H01L 51/50* (2013.01)

(58) Field of Classification Search
CPC . H01L 21/775; H01L 27/12; H01L 29/66757; H01L 29/66765; H01L 29/78621
USPC .......................................... 438/149
See application file for complete search history.

(56) References Cited

U.S. PATENT DOCUMENTS 6,255,131 B1 7/2001 Mori et al.
7,687,807 B2 * 3/2010 Koo et al. ............ 257/59
(Continued)

FOREIGN PATENT DOCUMENTS

EP 1524702 A2 4/2005
KR 10-2011-0069908 A 6/2011
(Continued)

OTHER PUBLICATIONS

Taiwanese Office Action, Taiwanese Application No. 101144375, Jan. 15, 2015, 15 pages.

*Primary Examiner* — Quoc Hoang
(74) *Attorney, Agent, or Firm* — Fenwick & West LLP

(57) ABSTRACT

Disclosed is a thin film transistor substrate which facilitates to improve output and transfer characteristics of thin film transistor, wherein the thin film transistor substrate comprises a thin film transistor comprising a lower gate electrode on a substrate, an active layer on the lower gate electrode, source and drain electrodes on the active layer, and an upper gate electrode on the source electrode, drain electrode and active layer, the upper gate electrode for covering a channel region defined by the source and drain electrodes; and a contact portion for electrically connecting the lower gate electrode with the upper gate electrode.

17 Claims, 15 Drawing Sheets

(51) Int. Cl.
  *H01L 29/786* (2006.01)
  *H01L 51/50* (2006.01)
  *H01L 29/417* (2006.01)

(56) References Cited

U.S. PATENT DOCUMENTS

| | | |
|---|---|---|
| 2005/0012097 A1 | 1/2005 | Yamazaki |
| 2005/0082530 A1 | 4/2005 | Koo et al. |
| 2007/0085938 A1* | 4/2007 | Yamazaki et al. .............. 349/43 |
| 2007/0290227 A1 | 12/2007 | Liang et al. |
| 2011/0084278 A1 | 4/2011 | Cho et al. |
| 2011/0108846 A1 | 5/2011 | Choi et al. |
| 2011/0136301 A1 | 6/2011 | Yamazaki et al. |
| 2011/0240986 A1 | 10/2011 | Tsai et al. |
| 2011/0284852 A1 | 11/2011 | Kim et al. |
| 2012/0007084 A1 | 1/2012 | Park et al. |
| 2012/0104385 A1 | 5/2012 | Godo et al. |

FOREIGN PATENT DOCUMENTS

| | | |
|---|---|---|
| TW | 200511589 A | 3/2005 |
| TW | 200801672 A | 1/2008 |
| TW | 201117370 A | 5/2011 |

* cited by examiner

THIN FILM TRANSISTOR SUBSTRATE AND METHOD FOR MANUFACTURING THE SAME AND ORGANIC LIGHT EMITTING DEVICE USING THE SAME

CROSS REFERENCE TO RELATED APPLICATIONS

This application is a divisional of U.S. patent application Ser. No. 13/685,572, titled "Thin Film Transistor Substrate and Method for Manufacturing the Same and Organic Light Emitting Device Using the Same" filed on Nov. 26, 2012, which claims the benefit of Korean Patent Application No. 10-2012-0088565 filed on Aug. 13, 2012, both of which are hereby incorporated by reference as if fully set forth herein.

BACKGROUND

1. Field of the Invention

The present invention relates to a display device, and more particularly, to a thin film transistor applied to a display device.

2. Discussion of the Related Art

A thin film transistor (TFT) is used as a switching element for controlling an operation of each pixel or a driving element for driving each pixel in a display device such as a liquid crystal display (LCD) or an organic light emitting device (OLED).

The thin film transistor includes a gate electrode, an active layer, and source/drain electrodes. Based on an arrangement of the electrodes, the thin film transistor may be classified into a staggered structure and a coplanar structure.

In case of the staggered structure, the gate electrode and the source/drain electrodes are vertically arranged with the active layer interposed therebetween. Meanwhile, in case of the coplanar structure, the gate electrode and the source/drain electrodes are arranged on the same plane.

According to a channel formation method, the thin film transistor of the staggered structure may be classified into a back channel etched (BCE) type and an etch stopper layer (ESL) type. In case of the ESL type, an etch stopper layer is formed on the active layer so that it is possible to prevent the active layer from being over-etched. Owing to this advantage, there is the increasing use of ESL type thin film transistor.

FIGS. 1A to 1E are cross sectional views illustrating a method for manufacturing an ESL type thin film transistor substrate.

First, as shown in FIG. 1A, a gate electrode 20 is formed on a substrate 10, and then a gate insulating layer 25 is formed on an entire surface of the substrate 10 including the gate electrode 20.

As shown in FIG. 1B, an active layer 30a and an etch stopper layer 40a are sequentially formed on the gate insulating layer 25. After that, as shown in FIG. 1C, the etch stopper layer 40a is patterned to thereby form a predetermined etch stopper 40. The etch stopper 40 functions as a stopper for an etching process to be described later.

Then, as shown in FIG. 1D, an ohmic contact layer 50a and a source/drain electrode layer 60a are sequentially formed on the entire surface of the substrate 10 including the etch stopper 40.

As shown in FIG. 1E, the source/drain electrode layer 60a is patterned to form a source electrode 62 and a drain electrode 64. Under the condition that the source/drain electrodes 62/64 are used as a mask, the ohmic contact layer 50a and active layer 30a positioned underneath the source/drain electrodes 62/64 are etched to thereby form an ohmic contact layer 50 and active layer 30 with a predetermined pattern.

The etch stopper 40 is not formed at left and right sides of the source/drain electrodes 62/64, whereby both the ohmic contact layer 50a and active layer 30a are etched together. However, since the etch stopper 40 is formed in a region between the source electrode 62 and the drain electrode 64, only the ohmic contact layer 50a is etched therein.

However, because the related art thin film transistor is formed in a single gate electrode structure with one gate electrode 20, as shown in FIGS. 1A to 1E, it is difficult to achieve output saturation characteristics. In addition, there is a non-negligible gap between transfer curves according to voltages between source and drain of a thin film transistor within a subthreshold region, whereby problems of crosstalk or non-uniform luminance such as spots may occur on a screen. Especially, if the thin film transistor with the single gate electrode structure is applied to the organic light emitting device, a compensation capacity may be deteriorated.

Also, in case of the related art thin film transistor with the etch stopper 40, the thin film transistor is inevitably increased in size due to an overlay rule in between each layer. Due to the increased size of thin film transistor, an overlap area between the gate electrode 20 and the source/drain electrodes 62/64 is increased in size, to thereby increase a capacitance of the thin film transistor.

SUMMARY

Accordingly, the present invention is directed to a thin film transistor substrate and a method for manufacturing the same that substantially obviates one or more problems due to limitations and disadvantages of the related art.

An aspect of the present invention is to provide a thin film transistor substrate which facilitates to improve output and transfer characteristics of thin film transistor, and a method for manufacturing the same.

Another aspect of the present invention is to provide a thin film transistor substrate which facilitates to restrict the increase of capacitance of a thin film transistor due to the increase of overlay rule.

Another aspect of the present invention is to provide an organic light emitting device using the above thin film transistor substrate.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a thin film transistor substrate comprising: a thin film transistor comprising a lower gate electrode on a substrate, an active layer on the lower gate electrode, source and drain electrodes on the active layer, and an upper gate electrode on the source electrode, drain electrode and active layer, the upper gate electrode for covering a channel region defined by the source and drain electrodes; and a contact portion for electrically connecting the lower gate electrode with the upper gate electrode.

In another aspect of the present invention, there is provided a method for manufacturing a thin film transistor substrate comprising: sequentially forming a lower gate electrode, a gate insulating layer and an active layer on a substrate; forming a first contact hole by patterning the gate insulating layer so as to expose the lower gate electrode; forming a source/drain electrode layer on the active layer; forming a source electrode, a drain electrode and a contact portion by patterning the source/drain electrode layer, wherein the contact portion is in contact with the lower gate electrode through the first contact hole; forming a passivation layer on an entire surface of the substrate including the source electrode, drain electrode, and contact portion; forming a second contact hole by patterning the passivation layer to expose the contact portion; and forming an upper gate electrode on the passivation layer, wherein the upper gate electrode covers a channel region defined by the source electrode and the drain electrode, and the upper gate electrode is brought into contact with the contact portion through the second contact hole.

In another aspect of the present invention, there is provided a method for manufacturing a thin film transistor substrate comprising: sequentially forming a lower gate electrode, a gate insulating layer and an active layer on a substrate; forming an etch stopper layer on an entire surface of the substrate including the active layer; forming a first contact hole by patterning the gate insulating layer and the etch stopper layer so as to expose the lower gate electrode; forming a source/drain electrode layer on the etch stopper layer; forming a source electrode, a drain electrode and a contact portion by patterning the source/drain electrode layer, wherein the contact portion is brought into contact with the lower gate electrode through the first contact hole; forming a passivation layer on the entire surface of the substrate including the source electrode, the drain electrode and the contact portion; forming a second contact hole by patterning the passivation layer to expose the contact portion; and forming an upper gate electrode on the passivation layer, wherein the upper gate electrode covers a channel region defined by the source electrode and the drain electrode, and the upper gate electrode is brought into contact with the contact portion through the second contact hole.

In a further aspect of the present invention, there is provided an OLED comprising: a substrate; a first thin film transistor on the substrate; a second thin film transistor connected with the first thin film transistor; a first contact portion connected with the first thin film transistor and the second thin film transistor; and an organic light emitting diode connected with the first thin film transistor, wherein the first thin film transistor comprises: a lower gate electrode on the substrate; an active layer on the lower gate electrode; source and drain electrodes on the active layer; and an upper gate electrode on the source electrode, the drain electrode and the active layer, the upper gate electrode for covering a channel region defined by the source electrode and the drain electrode, wherein the first contact portion is formed as a single body with the source electrode or drain electrode of the second thin film transistor so as to electrically connect the lower gate electrode and the upper gate electrode with each other.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

On explanation about the embodiments of the present invention, if it is mentioned that a first structure is positioned 'on or above' or 'under or below' a second structure, it should be understood that the first and second structures are brought into contact with each other, or a third structure is interposed between the first and second structures. However, if it is mentioned that a first structure is positioned 'directly on' or 'directly under' a second structure, it should be understood that the first and second structures are brought into contact with each other.

First Embodiment

Hereinafter, a thin film transistor substrate according to the first embodiment of the present invention and a method for manufacturing the same will be described with reference to FIGS. 2 and 3.

Thin Film Transistor Substrate

Figure 1A:
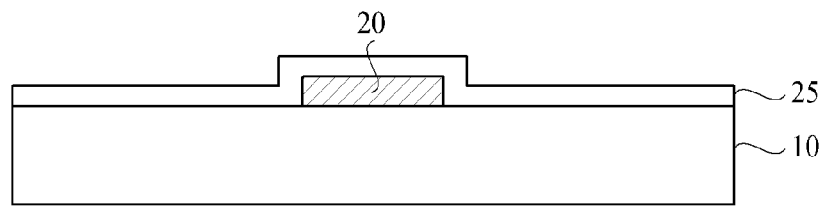
FIGS. 1A to 1E are cross sectional views illustrating a method for manufacturing an ESL type thin film transistor substrate.
Figure 1B:
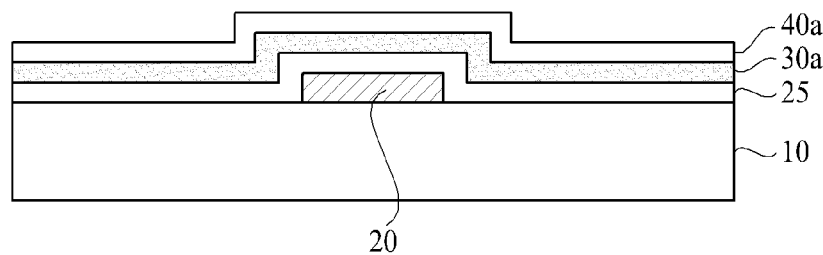
Figure 1C:
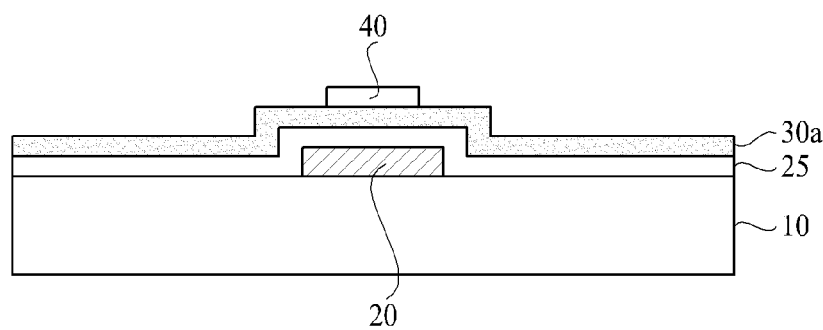
Figure 1D:
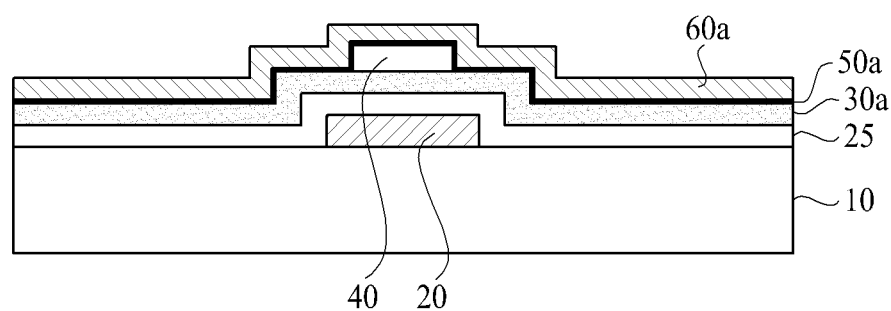
Figure 1E:
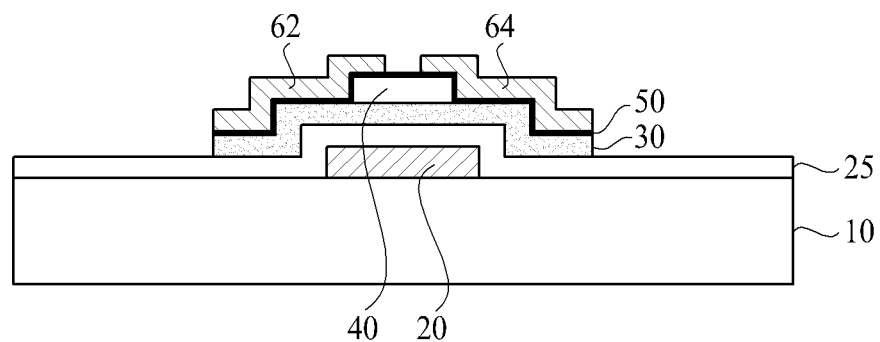
Figure 2A:
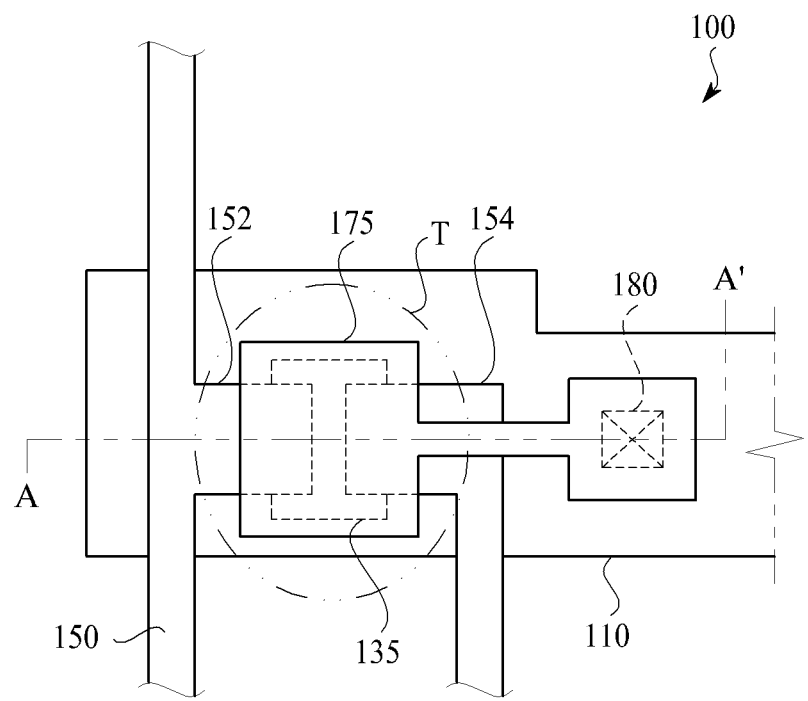
FIG. 2A is a plane view illustrating a thin film transistor substrate according to the first embodiment of the present invention.
Figure 2B:
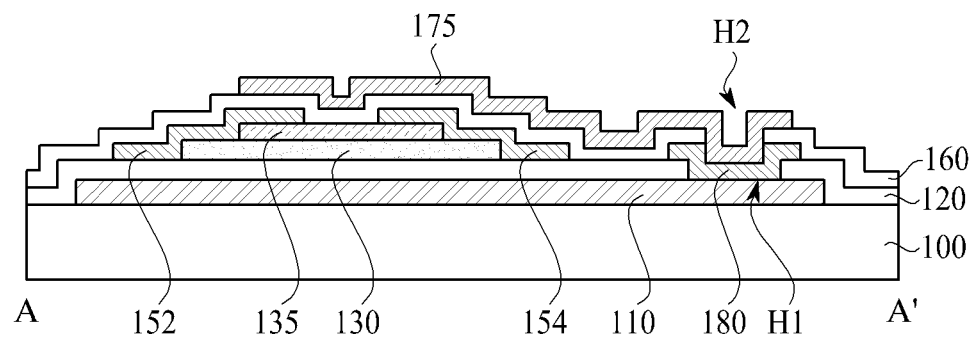
FIG. 2B is a cross sectional view along A-A' of FIG. 2A.

FIG. 2A is a plane view illustrating a thin film transistor substrate according to the first embodiment of the present invention. FIG. 2B is a cross sectional view along A-A' of FIG. 2A.

First, the thin film transistor substrate according to the first embodiment of the present invention will be described with reference to FIG. 2A.

As shown in FIG. 2A, a thin film transistor (T) and a contact portion 180 are formed on the thin film transistor substrate 100, wherein the thin film transistor (T) functions as a switching element for controlling an operation of each pixel, or a driving element for driving each pixel.

The thin film transistor (T) includes a lower gate electrode 110, an etch stopper layer 135, a source electrode 152, a drain electrode 154, and an upper gate electrode 175.

The lower gate electrode 110 is formed on the thin film transistor substrate 100. The lower gate electrode 110 is electrically connected with the upper gate electrode 175 through the contact portion 180. The lower gate electrode 110 may be diverged from a gate line (not shown).

The etch stopper layer 135 is formed between the source electrode 152 and the drain electrode 154. The etch stopper layer 135 prevents an active layer (not shown) formed thereunder from being over-etched.

The source electrode 152 is connected with a data line 150, and more particularly, the source electrode 152 may be diverged from the data line 150. The drain electrode 154 is formed on the active layer while being opposite to the source electrode 152. The drain electrode 154 is formed at a predetermined interval from the source electrode 152. A channel region is defined by the source electrode 152 and drain electrode 154.

According to one embodiment of the present invention, the source electrode 152 or drain electrode 154 may be overlapped with at least a portion of the lower gate electrode 110, or may be overlapped with at least a portion of the upper gate electrode 175.

The upper gate electrode 175 is formed above the etch stopper layer 135, to thereby cover the channel region defined by the source electrode 152 and drain electrode 154.

According to one embodiment of the present invention, if the thin film transistor substrate 100 is applied to an organic light-emitting device (OLED), the upper gate electrode 175 may be formed of an anode electrode of an organic light-emitting diode for the OLED.

The contact portion 180 electrically connects the lower gate electrode 110 with the upper gate electrode 175. According to one embodiment of the present invention, the contact portion 180 is formed at a predetermined interval from the drain electrode 154, wherein the contact portion 180 may be formed in an island shape. In this case, the contact portion 180 may be formed of the same material as that of the source electrode 152 or drain electrode 154.

As mentioned above, the thin film transistor (T) according to the present invention is formed in a dual gate electrode structure where the lower gate electrode 110 is formed below the active layer, and the upper gate electrode 175 is formed above the active layer. The lower gate electrode 110 and upper gate electrode 175 of the thin film transistor (T) are electrically connected with each other through the contact portion 180.

Hereinafter, the thin film transistor substrate according to the first embodiment of the present invention will be described in more detail with reference to FIG. 2B.

As shown in FIG. 2B, the lower gate electrode 110 is formed on the thin film transistor substrate 100, and then a gate insulating layer 120 is formed on an entire surface of the substrate 100 including the lower gate electrode 110.

According to one embodiment of the present invention, a first contact hole (H1) for exposing a predetermined portion of the lower gate electrode 110 so as to form the contact portion 180 is formed in the gate insulating layer 120.

The active layer 130 is formed on the gate insulating layer 120, and the etch stopper layer 135 is formed on the active layer 130. According to one embodiment of the present invention, the active layer 130 may be formed of an oxide semiconductor.

The source electrode 152 and drain electrode 154 are formed on the etch stopper layer 135. Also, the source electrode 152 and drain electrode 154 are formed on predetermined regions of the active layer 130, wherein the predetermined regions indicate the regions which are not overlapped with the etch stopper layer 135, to thereby protect the active layer 130. Although not shown, an ohmic contact layer may be additionally interposed between the active layer 130 and the source/drain electrodes 152/154.

A passivation layer 160 is formed on the entire surface of the substrate 100 including the source/drain electrodes 152/154. According to one embodiment of the present invention, a second contact hole (H2) is formed in the passivation layer 160. Through the second contact hole (H2), at least a portion of the contact portion 180 is exposed so that the contact portion 180 is brought into contact with the upper gate electrode 175.

According to one embodiment of the present invention, the first contact hole (H1) and second contact hole (H2) may be completely overlapped with each other. In a modified embodiment of the present invention, the first contact hole (H1) and second contact hole (H2) may be partially overlapped with each other, or may not be overlapped with each other.

The upper gate electrode 175 is formed on the passivation layer 160. The upper gate electrode 175 covers at least the channel region. Also, since the upper gate electrode 175 is filled in the second contact hole (H2), the upper gate electrode 175 is brought into contact with the contact portion 180 exposed through the second contact hole (H2), whereby the upper gate electrode 175 is electrically connected with the lower gate electrode 110.

According to one embodiment of the present invention, a material for the upper gate electrode 175 may be different from a material for the lower gate electrode 110. For example, the upper gate electrode 175 may be formed of a material whose transparency is higher than that of the lower gate electrode 110.

The contact portion 180 is filled in the first contact hole (H1) formed in the gate insulating layer 120. The contact portion 180 may be formed on predetermined portions of the gate insulating layer 120 in the periphery of the first contact hole (H1). According to one embodiment of the present invention, the contact portion 180 may be formed of the same material as those of the source/drain electrodes 152/154.

The contact portion 180 is brought into contact with the lower gate electrode 110 exposed through the first contact hole (H1), and is simultaneously brought into contact with the upper gate electrode 175 through the second contact hole (H2), whereby the lower gate electrode 110 and upper electrode 175 are electrically connected with each other.

In the aforementioned embodiment of the present invention, the reason why the two contact holes (H1 and H2) are used so as to electrically connect the lower gate electrode 110 and upper gate electrode 175 with each other is that etching the plurality of layers at once is difficult. However, if each of the multiple layers is thin, or an etching technology is highly developed, it is possible to form the hole by etching the plurality of layers at once. In this case, the lower gate electrode 110 and upper gate electrode 175 may be electrically connected with each other through one contact hole.

As described above, the thin film transistor (T) according to the first embodiment of the present invention is formed in the dual gate electrode structure where the lower gate electrode 110 is formed below the active layer 130, and the upper gate electrode 175 is formed above the active layer 130, whereby electrons drift using lower and upper surfaces of the active layer 130.

Figure 3A:
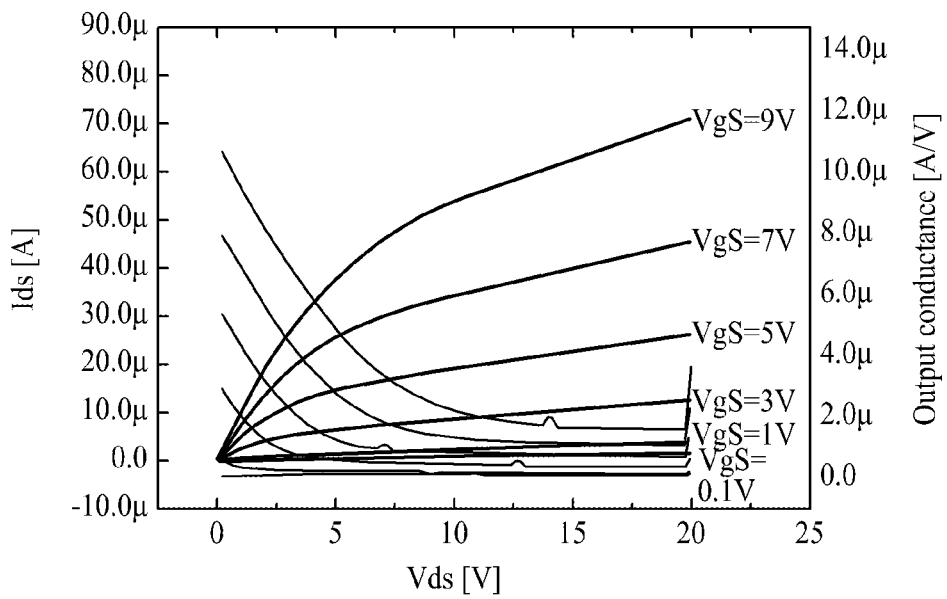
FIG. 3A is a graph illustrating characteristics of a thin film transistor according to the related art.
Figure 3B:
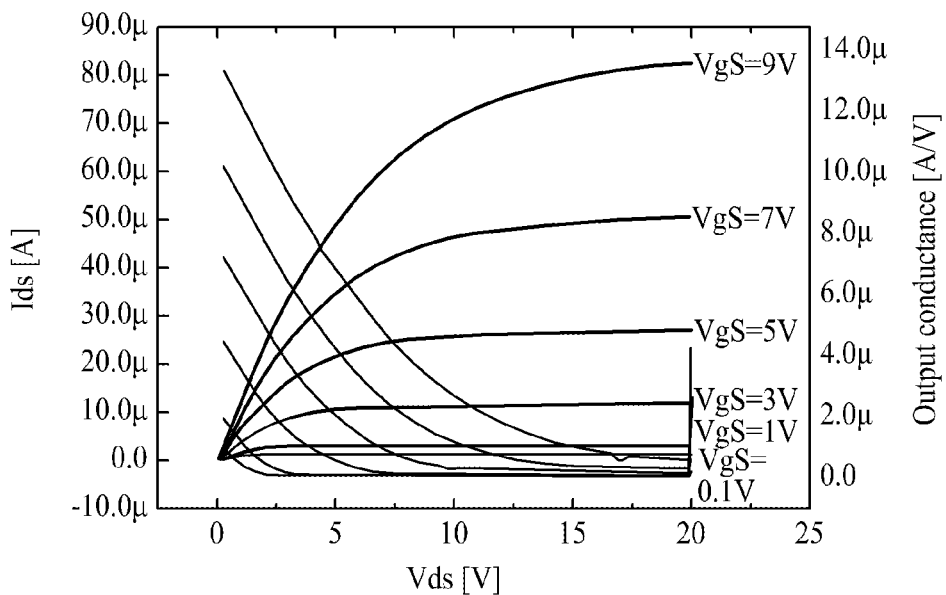
FIG. 3B is a graph illustrating characteristics of a thin film transistor according to the present invention.

As shown in graphs of FIGS. 3A and 3B, in comparison with the related art thin film transistor with the single gate electrode structure, the thin film transistor (T) with the dual gate electrode structure according to the present invention can obtain the improved output saturation characteristics. Also, it is possible to decrease a gap between transfer curves according to voltages between source and drain of the thin film transistor within a subthreshold region.

Accordingly, the thin film transistor (T) with the dual gate electrode structure according to the present invention facilitates to improve luminance uniformity of display device, current capacity and compensation capacity of thin film transistor, and to reduce power consumption.

In case of the present invention, it is possible to prevent external light from being incident on bottom and top surfaces of the thin film transistor (T) by the lower gate electrode 110 and upper gate electrode 175, to thereby improve bias temperature stress (BTS) characteristics of the thin film transistor (T). In addition, it is possible to prevent external gas (O2) or moisture (H2O) from penetrating into the bottom and top surfaces of the thin film transistor (T).

In the thin film transistor (T) according to the present invention, local and global luminance uniformity may be improved, and bright dot and black dot defect may be diminished by shielding an electric field in the bottom and top surfaces of the thin film transistor (T) using the lower gate electrode 110 and upper gate electrode 175.

Method for Manufacturing Thin Film Transistor Substrate

FIGS. 4A to 4H are cross sectional views illustrating a method for manufacturing the thin film transistor substrate according to the first embodiment of the present invention, which are cross sectional views along A-A' of FIG. 2A.

Figure 4A:
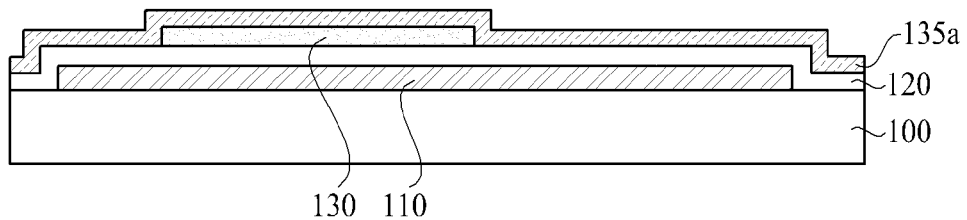
FIGS. 4A to 4H are cross sectional views illustrating a method for manufacturing the thin film transistor substrate according to the first embodiment of the present invention.

First, as shown in FIG. 4A, the lower gate electrode 110 is formed on the substrate 100, and the gate insulating layer 120 is formed on the entire surface of the substrate 100 including the lower gate electrode 110. Then, the active layer 130 is formed on the gate insulating layer 120, and a material layer 135a for forming the etch stopper layer 135 is formed on the entire surface of the substrate 100 including the active layer 130.

Figure 4B:
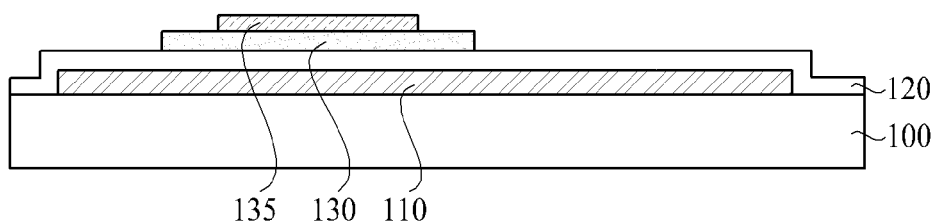

As shown in FIG. 4B, the material layer 135a is patterned to form the etch stopper layer 135 on the active layer 130.

Figure 4C:
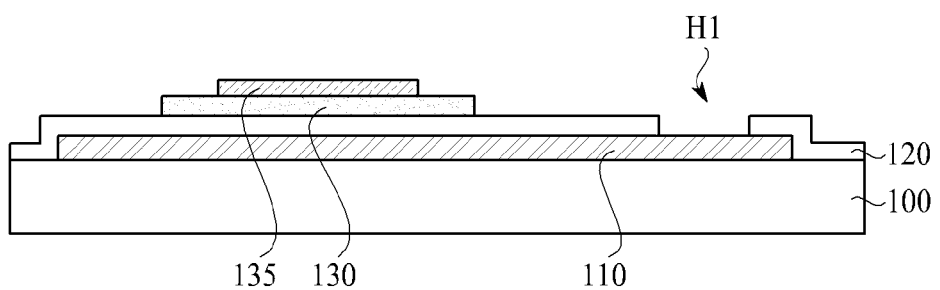

As shown in FIG. 4C, the first contact hole (H1) for exposing the lower gate electrode 110 is formed in the gate insulating layer 120.

Figure 4D:
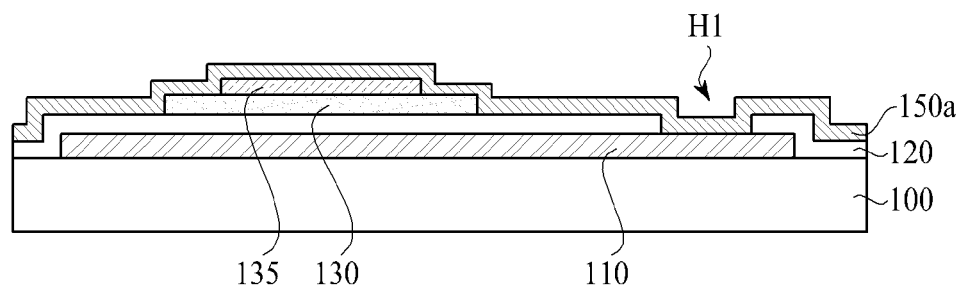

As shown in FIG. 4D, a source/drain electrode layer 150a is formed on the entire surface of the substrate 100 including the etch stopper layer 135.

Figure 4E:
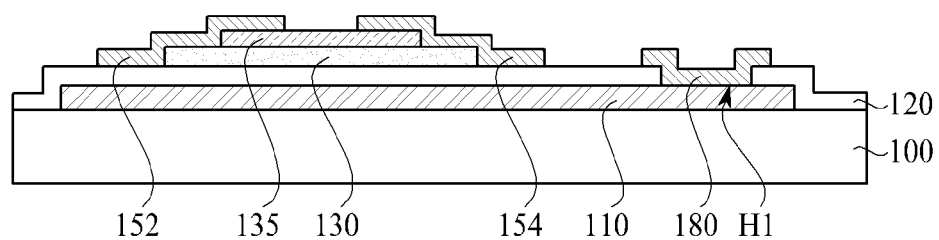

As shown in FIG. 4E, the source/drain electrode layer 150a is patterned, thereby forming the source electrode 152 and drain electrode 154 with a predetermined interval therebetween, and simultaneously forming the contact portion 180 inside the first contact hole (H1).

Figure 4F:
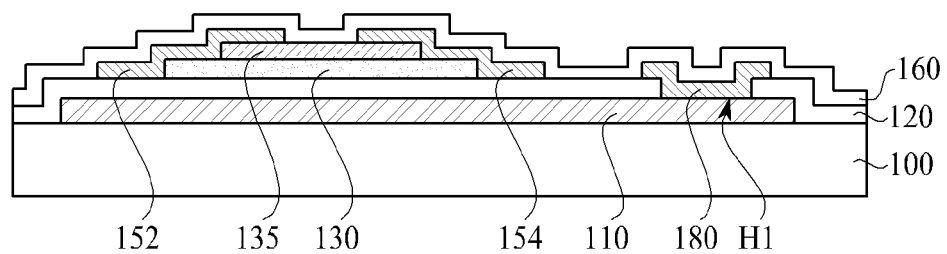

As shown in FIG. 4F, the passivation layer 160 is formed on the entire surface of the substrate 100 including the source/drain electrodes 152/154.

Figure 4G:
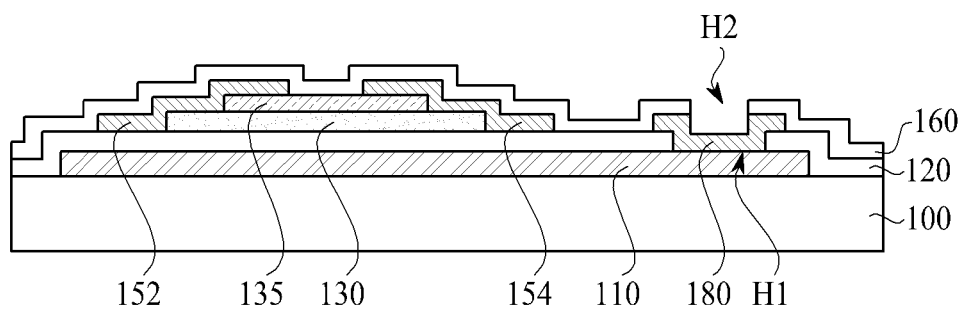

As shown in FIG. 4G, the second contact hole (H2) for exposing the contact portion 180 is formed in the passivation layer 160.

Figure 4H:
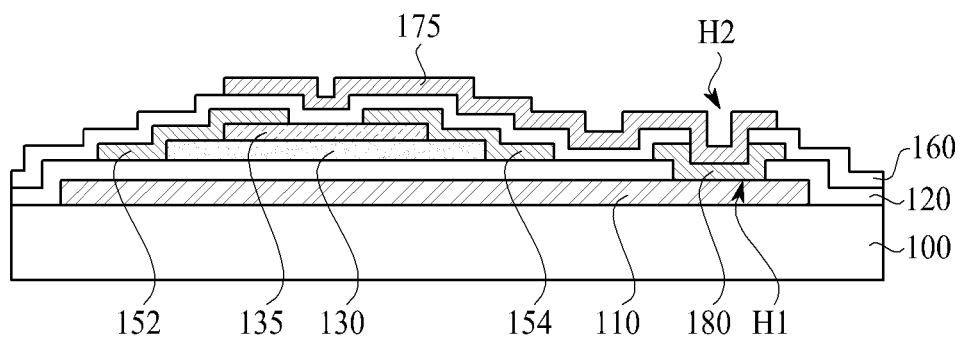

As shown in FIG. 4H, the upper gate electrode 175 is formed on the passivation layer 160. In this case, since the upper gate electrode 175 is filled in the second contact hole (H2), the upper gate electrode 175 is brought into contact with the contact portion 180, whereby the upper gate electrode 175 is electrically connected with the lower gate electrode 110.

Second Embodiment

In the above description for the first embodiment of the present invention, the etch stopper layer 135 is formed only in the channel region on the active layer 130, whereby the source electrode 152 and drain electrode 154 cover all regions of the active layer 130 except the channel region.

However, in case of the second embodiment of the present invention, an etch stopper layer 135 is formed not only in the channel region but also in regions except the channel region on an active layer 130, whereby the etch stopper layer 135 covers the active layer 130.

Hereinafter, the thin film transistor substrate according to the second embodiment of the present invention will be described in more detail with reference to FIGS. 5 and 6. For the following description, wherever possible, the same reference numbers will be used throughout the drawings to refer to the same or like parts as those of the first embodiment of the present invention.

Thin Film Transistor Substrate

Figure 5A:
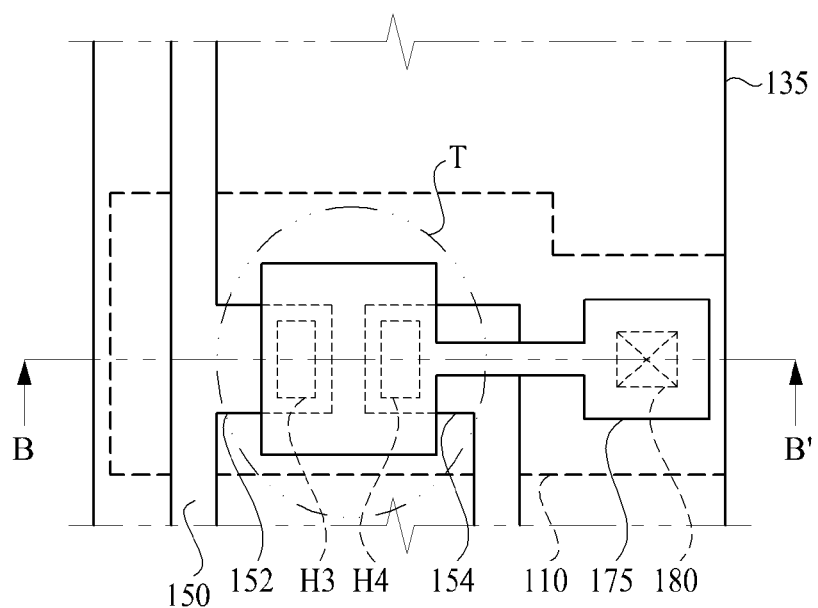
FIG. 5A is a plane view illustrating a thin film transistor substrate according to the second embodiment of the present invention.
Figure 5B:
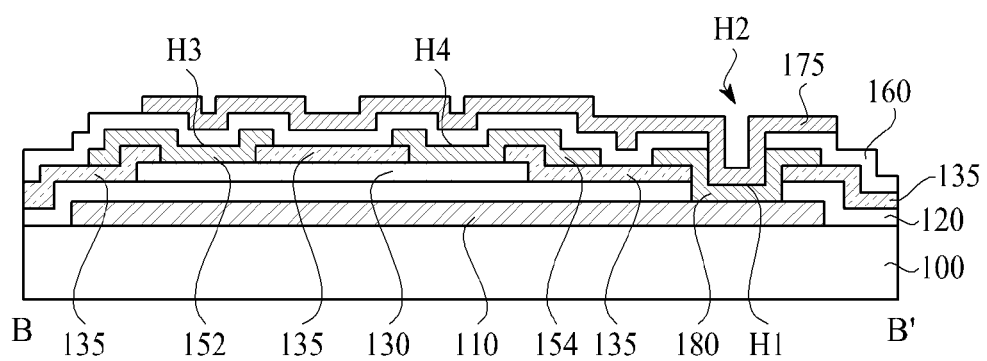
FIG. 5B is a cross sectional view along B-B' of FIG. 5A.

FIG. 5A is a plane view illustrating a thin film transistor substrate according to the second embodiment of the present invention. FIG. 5B is a cross sectional view along B-B' of FIG. 5A.

First, the thin film transistor substrate according to the second embodiment of the present invention will be described with reference to FIG. 5A. As shown in FIG. 5A, a thin film transistor (T) and a contact portion 180 are formed on a thin film transistor substrate 100, wherein the thin film transistor (T) functions as a switching element for controlling an operation of each pixel, or a driving element for driving each pixel.

The thin film transistor (T) includes a lower gate electrode 110, the etch stopper layer 135, a source electrode 152, a drain electrode 154, and an upper gate electrode 175.

The lower gate electrode 110 is formed on the thin film transistor substrate 100. The lower gate electrode 110 is electrically connected with the upper gate electrode 175 through the contact portion 180. The lower gate electrode 110 may be diverged from a gate line (not shown).

The etch stopper layer 135 prevents the active layer (not shown) formed thereunder from being over-etched. The etch stopper layer 135 according to the second embodiment of the present invention is formed on an entire surface of the substrate 100 including the lower gate electrode 110. In a modified embodiment of the present invention, the etch stopper layer 135 may be formed on a predetermined region of the substrate 100. For example, the etch stopper layer 135 may be formed on at least one of a first region and a second region of the substrate 100, wherein the first region may include the thin film transistor region and a line region, and the second region may include a region provided with a storage capacitor.

In order to bring the source electrode 152 and drain electrode 154 into contact with the active layer 130, as shown in FIG. 5A, third contact hole (H3) and fourth contact hole (H4) are formed in the etch stopper layer 135. For example, the source electrode 152 and active layer 130 are brought into contact with each other through the third contact hole (H3), and the drain electrode 154 and active layer 130 are brought into contact with each other through the fourth contact hole (H4).

The source electrode 152 is connected with a data line 150, and more particularly, the source electrode 152 may be diverged from the data line 150. The drain electrode 154 is formed on the active layer while being opposite to the source electrode 152, wherein the drain electrode 154 is formed at a predetermined interval from the source electrode 152. A channel region is defined by the source electrode 152 and drain electrode 154.

According to one embodiment of the present invention, the source electrode 152 or drain electrode 154 may be overlapped with at least a portion of the lower gate electrode 110, or may be overlapped with at least a portion of the upper gate electrode 175.

The upper gate electrode 175 is formed above the etch stopper layer 135, to thereby cover the channel region defined by the source electrode 152 and drain electrode 154.

According to one embodiment of the present invention, if the thin film transistor substrate 100 is applied to an organic light emitting device (OLED), the upper gate electrode 175 may be formed of an anode electrode of an organic light emitting diode for the OLED.

The contact portion 180 electrically connects the lower gate electrode 110 with the upper gate electrode 175. In the same manner as the first embodiment of the present invention, the contact portion 180 is formed at a predetermined interval from the drain electrode 154, wherein the contact portion 180 may be formed in an island shape. In this case, the contact portion 180 may be formed of the same material as that of the source electrode 152 or drain electrode 154.

Hereinafter, the thin film transistor substrate according to the second embodiment of the present invention will be described in more detail with reference to FIG. 5B.

As shown in FIG. 5B, the lower gate electrode 110 is formed on the thin film transistor substrate 100, and then a gate insulating layer 120 is formed on the entire surface of the substrate 100 including the lower gate electrode 110 (for example, the thin film transistor region and the line region except a region on which the storage capacitor is formed of the substrate 100). Then, the active layer 130 is formed on the gate insulating layer 120. According to one embodiment of the present invention, the active layer 130 may be formed of an oxide semiconductor.

The etch stopper layer 135 is formed on the entire surface of the substrate 100 including the active layer 130, as mentioned above. In this case, the third contact hole (H3) and fourth contact hole (H4) are formed in the etch stopper layer 135. For example, the source electrode 152 and active layer 130 are brought into contact with each other through the third contact hole (H3), and the drain electrode 154 and active layer 130 are brought into contact with each other through the fourth contact hole (H4).

In case of the thin film transistor (T) according to the first embodiment of the present invention, the source/drain electrodes 152/154 cover all regions of the active layer 130 except the channel region, whereby the overlap area between the source/drain electrodes 152/154 and the lower gate electrode 110 is increased in size. However, in case of the second embodiment of the present invention, the etch stopper layer 135 is formed on the entire surface of the substrate 100, whereby the etch stopper layer 135 covers all regions of the active layer 130 except the contact region between the source/drain electrodes 152/154 and the active layer 130.

Thus, in comparison with the first embodiment of the present invention, the second embodiment of the present invention is provided with the decreased overlap area between the lower gate electrode 110 and the source/drain electrodes 152/154. As shown in the following Table 1, when the thin film transistor (T) is turned-on/off, a capacitance of the thin film transistor (T) according to the second embodiment of the present invention is reduced largely in comparison with the first embodiment of the present invention.

TABLE 1

| kind | Completion value | First embodiment | | Second embodiment | | Off cap ratio First embodiment/ Second embodiment (%) | On cap ratio First embodiment/ Second embodiment (%) |
|---|---|---|---|---|---|---|---|
| | | Off cap | On cap | Off cap | On cap | | |
| Sw. TFT | 5/11.4 | 14.2 | 33.15 | 11.15 | 26.8 | 79% | 82% |
| Sc. TFT | 10/11.4 | 20.5 | 50.45 | 16.14 | 41.27 | 79% | 82% |
| Dr. TFT | 100/11.4 | CGS 141.2  CGD 53.3 | 288 | CGS 109  CGD 53.3 | 256.33 | CGS 77%  CGD The same | 89% |

Also, the contact region between the active layer 130 and the source/drain electrodes 152/154 is determined based on a design rule of the etch stopper layer 135, whereby an overlay rule of the active layer 130 and the source/drain electrodes 152/154 has no influence on the left direction (for example, the direction facing from the drain electrode toward the source electrode in FIG. 5B) and the right direction (for example, the direction facing from the source electrode toward the drain electrode in FIG. 5B).

Also, if the active layer 130 is formed of the oxide semiconductor, passivation of the active layer 130 has a large influence on reliability of the thin film transistor (T). In case of the second embodiment of the present invention, the etch stopper layer 135 protects not only channel region but also all regions of the active layer 130 except the contact region between the active layer 130 and the source/drain electrodes 152/154, whereby reliability of the thin film transistor (T) may be improved.

As mentioned above, a parasitic capacitance of the thin film transistor (T) is minimized owing to the structure of the etch stopper layer 135, to thereby reduce a line resistance.

For forming the contact portion 180, a first contact hole (H1) for exposing a predetermined portion of the lower gate electrode 110 is formed in the gate insulating layer 120 and etch stopper layer 135.

The source/drain electrodes 152/154 are formed on the etch stopper layer 135. As mentioned above, the source/drain electrodes 152/154 are bought into contact with the active layer 130 through the third and fourth contact holes (H3, H4). Although not shown, an ohmic contact layer may be additionally interposed between the active layer 130 and the source/drain electrodes 152/154.

A passivation layer 160 is formed on the entire surface of the substrate 100 including the source/drain electrodes 152/154. Then, a second contact hole (H2) for exposing at least a portion of the contact portion 180 is formed in the passivation layer 160, to thereby bring the contact portion 180 into contact with the upper gate electrode 175.

The first contact hole (H1) and second contact hole (H2) may be completely overlapped with each other. According to a modified embodiment of the present invention, the first contact hole (H1) and second contact hole (H2) may be partially overlapped with each other, or may not be overlapped with each other.

The upper gate electrode 175 is formed on the passivation layer 160, wherein the upper gate electrode 175 covers at least the channel region. Also, since the upper gate electrode 175 is filled in the second contact hole (H2), the upper gate electrode 175 is brought into contact with the contact portion 180 exposed through the second contact hole (H2), whereby the upper gate electrode 175 is electrically connected with the lower gate electrode 110.

According to one embodiment of the present invention, a material for the upper gate electrode 175 may be different from a material for the lower gate electrode 110. For example, the upper gate electrode 175 may be formed of a material whose transparency is higher than that of the lower gate electrode 110.

The contact portion 180 is formed inside the first contact hole (H1) formed in the gate insulating layer 120 and etch stopper layer 135. The contact portion 180 may be formed not only inside the first contact hole (H1) but also on predetermined portions of the etch stopper layer 135 in the periphery of the first contact hole (H1). According to one embodiment of the present invention, the contact portion 180 may be formed of the same material as those of the source/drain electrodes 152/154. The contact portion 180 is brought into contact with the lower gate electrode 110 exposed through the first contact hole (H1), and is simultaneously brought into contact with the upper gate electrode 175 exposed through the second contact hole (H2), whereby the lower gate electrode 110 and upper gate electrode 175 are electrically connected with each other.

In the aforementioned embodiment of the present invention, the reason why the two contact holes (H1 and H2) are used so as to electrically connect the lower gate electrode 110 and upper gate electrode 175 with each other is that etching the plurality of layers at once is difficult. However, if each of the multiple layers is thin, or an etching technology is highly developed, it is possible to form the hole by etching the plurality of layers at once. In this case, the lower gate electrode 110 and upper gate electrode 175 may be electrically connected with each other through one contact hole.

As mentioned above, the thin film transistor (T) according to the second embodiment of the present invention is formed in a dual gate electrode structure, and the etch stopper layer 135 is formed on the entire surface of the substrate 110. Thus, the thin film transistor (T) according to the second embodiment of the present invention enables to have efficiency of the thin film transistor (T) of the dual gate electrode structure disclosed in the first embodiment of the present invention, and also to reduce the line resistance and capacitance of thin film transistor (T).

Method for Manufacturing Thin Film Transistor Substrate

FIGS. 6A to 6H are cross sectional views illustrating a method for manufacturing the thin film transistor substrate according to the second embodiment of the present invention, which are cross sectional views along B-B' of FIG. 5A.

Figure 6A:
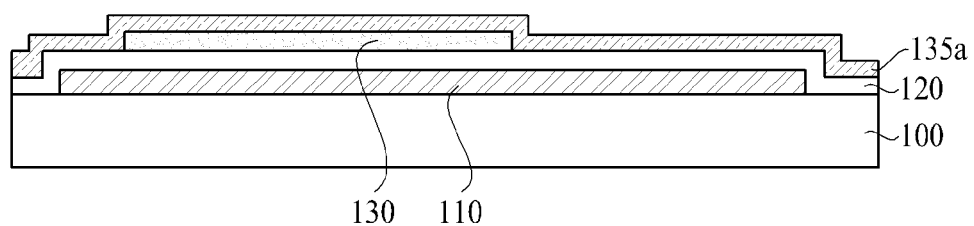
FIGS. 6A to 6H are cross sectional views illustrating a method for manufacturing the thin film transistor substrate according to the second embodiment of the present invention.

First, as shown in FIG. 6A, the lower gate electrode 110 is formed on the substrate 100, and the gate insulating layer 120 is formed on the entire surface of the substrate 100 including the lower gate electrode 110. Then, the active layer 130 is formed on the gate insulating layer 120, and a material layer 135a for forming the etch stopper layer 135 is formed on the entire surface of the substrate 100 including the active layer 130.

Figure 6B:
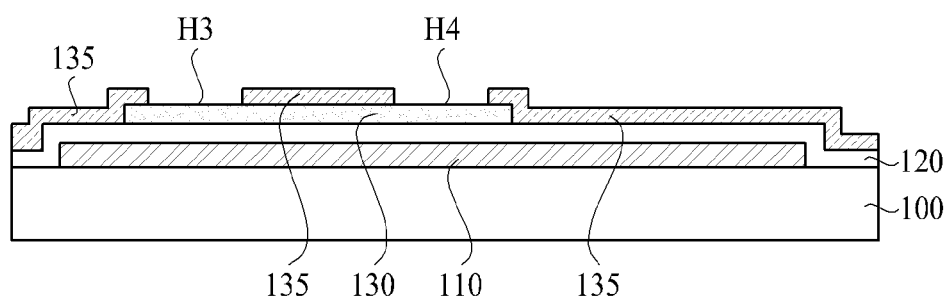

As shown in FIG. 6B, the material layer 135a is patterned to form the etch stopper layer 135 including the third and fourth contact holes (H3, H4) for exposing the active layer 130.

Figure 6C:
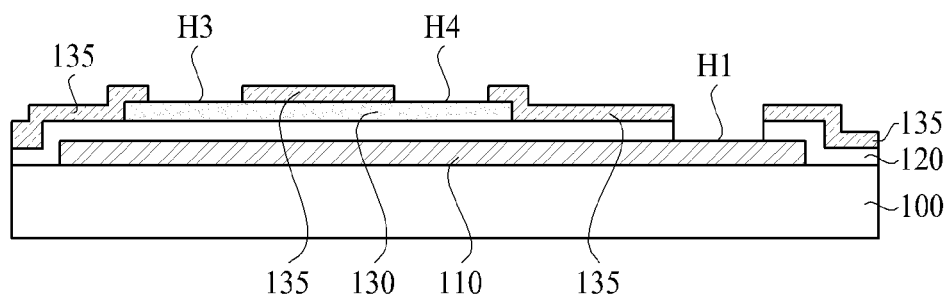

As shown in FIG. 6C, the first contact hole (H1) for exposing the lower gate electrode 110 is formed by patterning the gate insulating layer 120 and etch stopper layer 135.

In FIGS. 6B and 6C, the process for forming the third and fourth contact holes (H3, H4) and the process for forming the first contact hole (H1) are performed separately. According to a modified embodiment of the present invention, the process for forming the third and fourth contact holes (H3, H4) and the process for forming the first contact hole (H1) may be performed through single etching process.

Figure 6D:
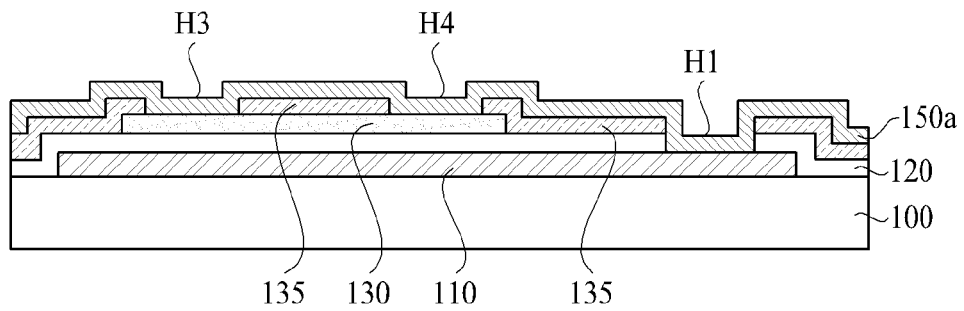

Then, as shown in FIG. 6D, a source/drain electrode layer 150a is formed on the entire surface of the substrate 100 including the etch stopper layer 135.

Figure 6E:
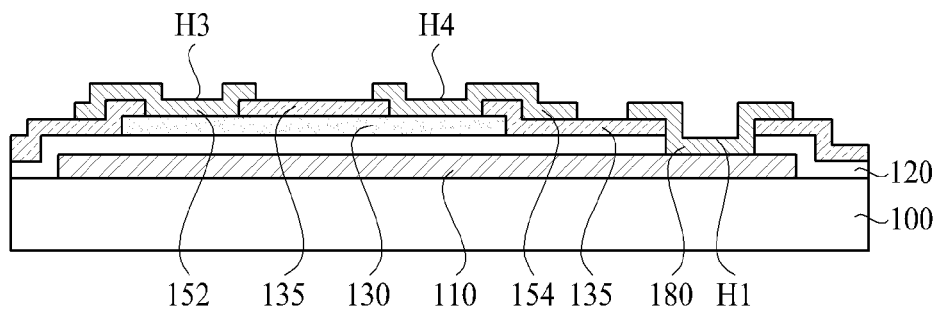

As shown in FIG. 6E, the source/drain electrode layer 150a is patterned, thereby forming the source electrode 152 and drain electrode 154 with a predetermined interval therebetween, and simultaneously forming the contact portion 180 inside the first contact hole (H1). Accordingly, the source electrode 152 is brought into contact with the active layer 130 through the third contact hole (H3), and the drain electrode 154 is brought into contact with the active layer 130 through the fourth contact hole (H4).

Figure 6F:
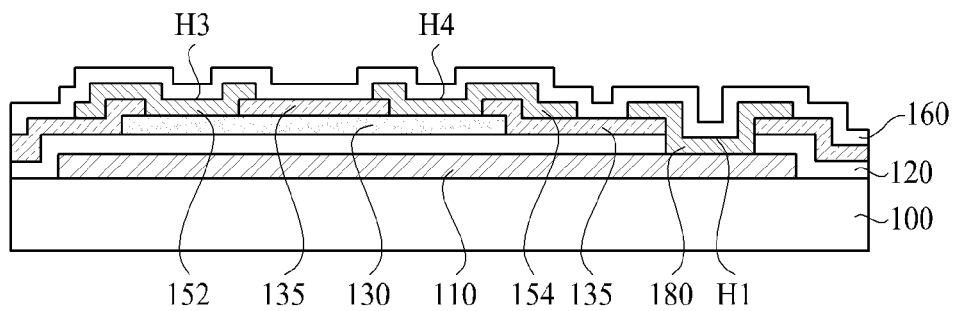

As shown in FIG. 6F, the passivation layer 160 is formed on the entire surface of the substrate 100 including the source/drain electrodes 152/154.

Figure 6G:
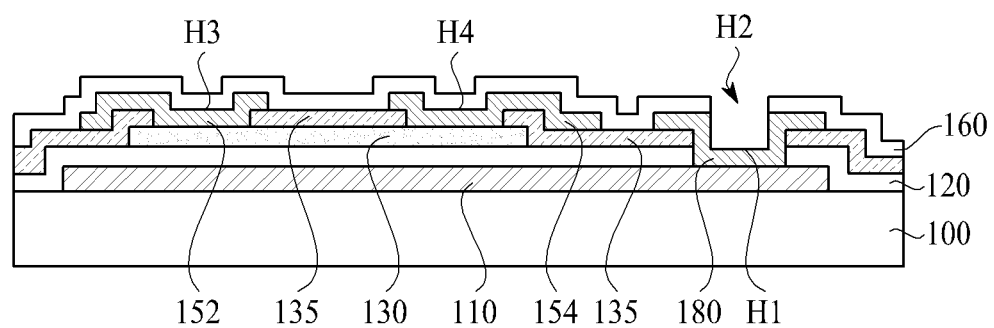

As shown in FIG. 6G, the second contact hole (H2) for exposing the contact portion 180 is formed in the passivation layer 160.

Figure 6H:
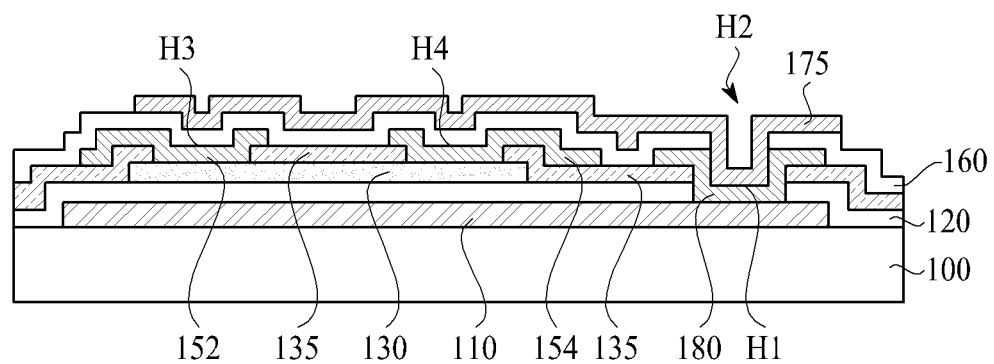

As shown in FIG. 6H, the upper gate electrode 175 is formed on the passivation layer 160. In this case, since the upper gate electrode 175 is filled in the second contact hole (H2), the upper gate electrode 175 is brought into contact with the contact portion 180, whereby the upper gate electrode 175 is electrically connected with the lower gate electrode 110.

First Modified Embodiment

Figure 7A:
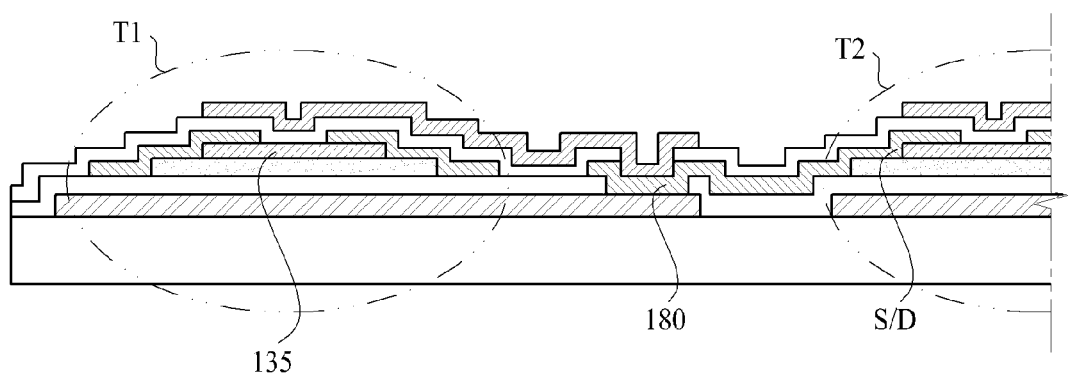
FIGS. 7A and 7B are cross sectional views of a thin film transistor substrate according to the first modified embodiment of the present invention.
Figure 7B:
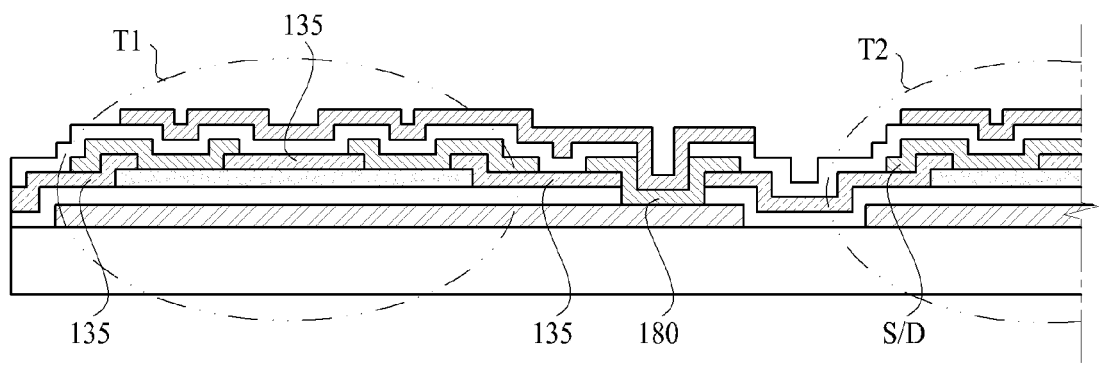

In the above first and second embodiments of the present invention, the contact portion 180 for electrically connecting the lower gate electrode 110 and upper gate electrode 175 of the thin film transistor (T1) is formed in the island shape. However, according to the first modified embodiment of the present invention, as shown in FIGS. 7A and 7B, a contact portion 180 may be formed as a single body with a source electrode or drain electrode (S or D) of a thin film transistor (T2).

Also, in the above first and second embodiments of the present invention, the source electrode 152 is connected with the data line 150. However, according to the first modified embodiment of the present invention, a source electrode 152 may be connected with a power line.

Second Modified Embodiment

Figure 8:
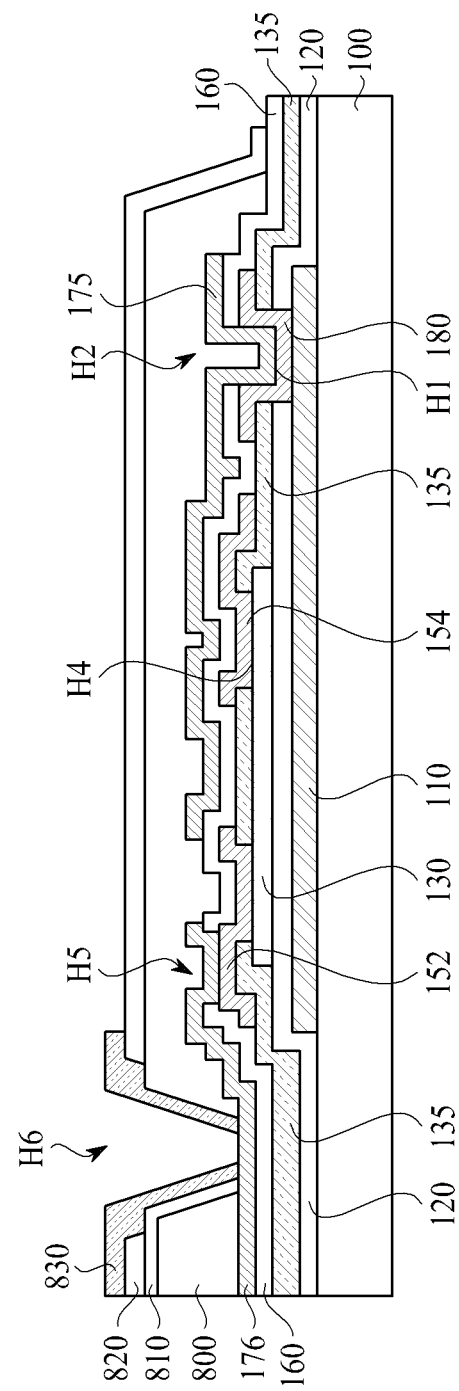
FIG. 8 is a cross sectional view of a thin film transistor substrate according to the second modified embodiment of the present invention.

If the thin film transistor substrate 100 according to the aforementioned embodiment of the present invention is applied to a bottom emission type OLED, as shown in FIG. 8, a connection electrode 176 is formed on a passivation layer 160, wherein the connection electrode 176 is provided at a predetermined interval from an upper gate electrode 175. On the connection electrode 176, there are a color filter layer 800, a planarization layer 810, and passivation layer 820 formed sequentially. Then, a pixel electrode 830 is additionally formed on the passivation layer 820, wherein the pixel electrode 830 functions as an anode electrode of a light emitting device.

In this case, the connection electrode 176 is formed of the same material as that of the upper gate electrode 175, and the connection electrode 176 is formed together with the upper gate electrode 175.

Through the connection electrode 176, the pixel electrode 830 may be electrically connected with the source or drain electrode 152 or 154. In more detail, as shown in FIG. 8, the connection electrode 176 is brought into contact with the source or drain electrode 152 or 154 through a fifth contact hole (H5) formed in the passivation layer 160; and the pixel electrode 830 is brought into contact with the connection electrode 176 through a sixth contact hole (H6) formed in the planarization layer 810 and passivation layer 820, whereby the pixel electrode 830 is electrically connected with the source or drain electrode 152 or 154.

This structure reduces a contact resistance by preventing oxidation of the source/drain electrodes 152/154, and also increases a capacitance of the thin film transistor substrate because a dual or triple capacitor is provided by additionally forming the connection electrode 176 between the lower gate electrode 110 and the pixel electrode 830, wherein the connection electrode 176 is formed of the same material as that of the upper gate electrode 175.

For convenience of explanation, FIG. 8 illustrates that the thin film transistor (T) has the structure shown in the second embodiment of the present invention. However, the thin film transistor (T) of FIG. 8 may have the structure shown in the first embodiment of the present invention.

Third Modified Embodiment

Figure 9A:
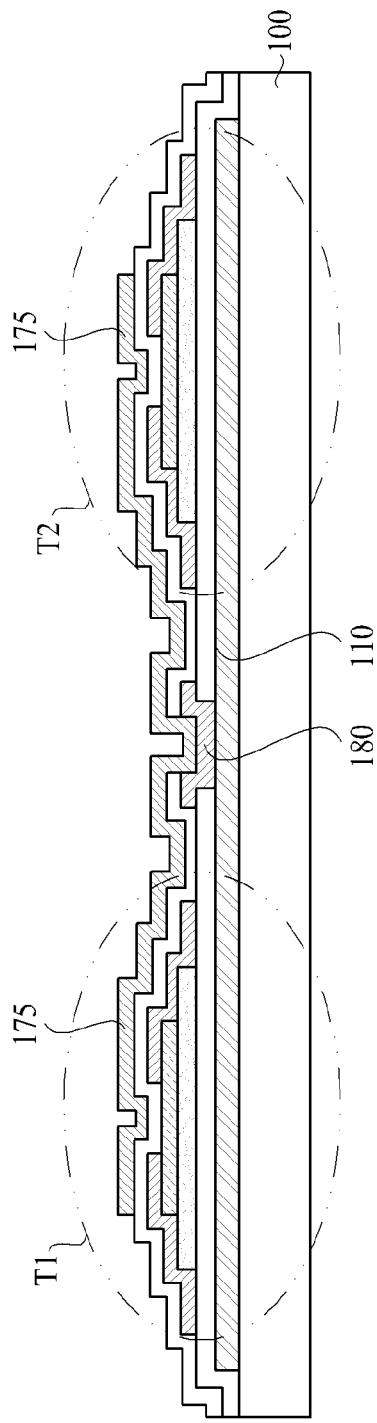
FIGS. 9A and 9B are cross sectional views of a thin film transistor substrate according to the third modified embodiment of the present invention.
Figure 9B:
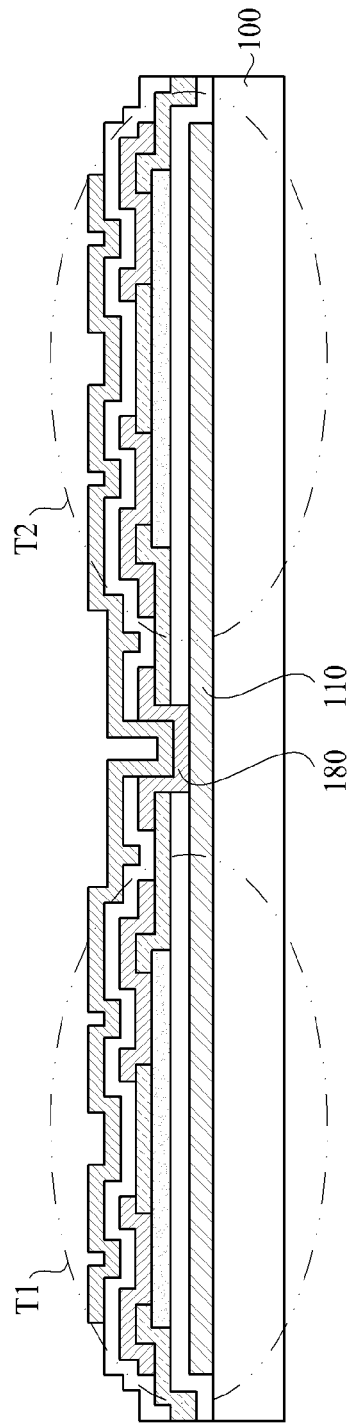

In the above embodiments of the present invention, one contact portion is formed for each thin film transistor on the thin film transistor substrate. However, in case of the third modified embodiment of the present invention, as shown in FIGS. 9A and 9B, a thin film transistor substrate may be provided in such a manner that two thin film transistors use one contact portion in common.

In more detail, as shown in FIG. 9, if the first thin film transistor (T1) and second thin film transistor (T2) use one lower gate electrode 110 in common, upper gate electrodes 715 of the first thin film transistor (T1) and second thin film transistor (T2) are formed as a single body, both the electric connection between the lower gate electrode 110 and upper gate electrode 175 of the first thin film transistor (T1) and the electric connection between the lower gate electrode 110 and upper gate electrode 175 of the second thin film transistor (T2) may be realized through the use of one contact portion 180.

In this case, as mentioned above, the contact portion 180 may be formed in an island shape.

Organic Light Emitting Device (OLED)

If the thin film transistor substrate according to the above embodiment of the present invention is applied to an OLED, the thin film transistors shown in FIGS. 2A/2B and FIGS. 3A/3B may be used as one or more switching thin film transistors constituting the OLED. Also, thin film transistors shown in FIGS. 7A and 7B may be used as driving thin film transistors constituting the OLED.

If the OLED includes two or more switching thin film transistors, at least two thin film transistors may electrically connect lower and upper gate electrodes with each other through the use of common contact portion shown in FIGS. 9A and 9B.

Figure 10:
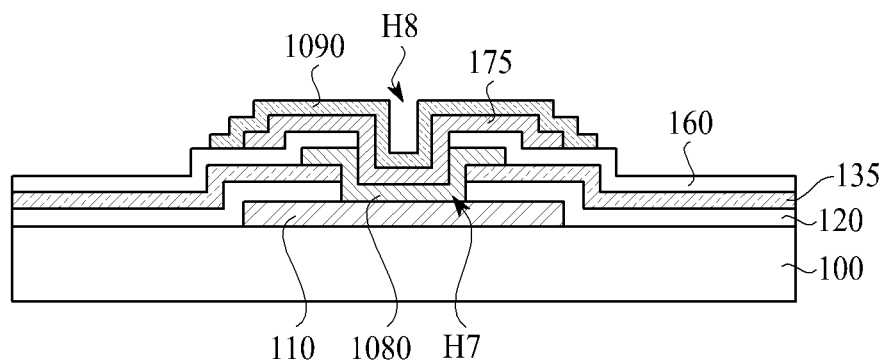
FIG. 10 is a cross sectional view of a storage capacitor according to one embodiment of the present invention.

Also, in case of a storage capacitor for the OLED, it may be formed in a structure shown in FIG. 10.

In more detail, as shown in FIG. 10, a lower gate electrode 110, a gate insulating layer 120, an etch stopper layer 135 are sequentially formed on a substrate 100. Then, a seventh contact hole (H7) for exposing the lower gate electrode 110 is formed in the gate insulating layer 120 and etch stopper layer 135.

In this case, a contact portion 1080 is filled in the seventh contact hole (H7), wherein the contact portion 1080 is formed of the same material as those of source/drain electrodes (not shown).

Also, a passivation layer 160 is formed on the etch stopper layer 135, and an eighth contact hole (H8) for exposing the contact portion 1080 is formed in the passivation layer 160.

On the passivation layer 160, there is an upper gate electrode 175. According as the upper gate electrode 175 is filled in the eighth contact hole (H8), the upper gate electrode 175 is brought into contact with the contact portion 1080, whereby the upper gate electrode 175 is electrically connected with the lower gate electrode 110.

Also, a pixel electrode 1090 is formed on the upper gate electrode 175. According to one embodiment of the present invention, the pixel electrode 1090 may be formed of the same material as that of an anode electrode of an organic light emitting diode.

In the above embodiments of the present invention, the etch stopper layers are necessarily included. However, in case of modified embodiments of the present invention, the etch stopper layer may be omitted. In this case, the source and drain electrodes may be directly formed on the active layer.

According to the present invention, the lower gate electrode 110 is formed below the active layer 130, and the upper gate electrode 175 is formed above the active layer 130, whereby the electrons drift through both the lower and upper surfaces of the active layer 130, thereby achieving the output saturation characteristics, and, decreasing a gap between transfer curves according to voltages between source and drain of the thin film transistor within a subthreshold region.

According to the present invention, owing to the improved output and transfer characteristics of the thin film transistor, it is possible to the improve luminance uniformity of display device, current capacity of thin film transistor and compensation capacity, and to reduce the power consumption.

According to the present invention, it is possible to prevent external light from being incident on the bottom and top surfaces of the thin film transistor (T) by the lower gate electrode 110 and upper gate electrode 175, to thereby improve bias temperature stress (BTS) characteristics of the thin film transistor (T). In addition, it is possible to prevent external gas (O2) or moisture (H2O) from penetrating into the bottom and top surfaces of the thin film transistor (T).

According to the present invention, the local and global luminance uniformity may be improved, and bright dot and black dot defect may be diminished by shielding the electric field in the bottom and top surfaces of the thin film transistor (T) using the lower gate electrode 110 and upper gate electrode 175.

According to the present invention, the upper gate electrode 175 is positioned between the pixel electrode 830 and the source/drain electrodes 152/154, to thereby reduce the contact resistance by preventing oxidation of the source/drain electrodes 152/154.

According to the present invention, the dual or triple capacitor is provided by additionally forming the upper gate electrode 175 between the lower gate electrode 110 and the pixel electrode 830, to increase the capacitance of the thin film transistor substrate According to the present invention, the etch stopper layer 135 is formed on the thin film transistor region and the line region except the storage capacitor, and then the etch stopper layer 135 is patterned based on the minimum design rule for the contact between the active layer 130 and the source/drain electrodes 152/154, so that it is possible to decrease the overlap area between the gate electrode and the source/drain electrodes 152/154. Thus, the capacitance of thin film transistor according to the present invention is reduced when the thin film transistor is turned-on/off.

According to the present invention, the etch stopper layer 135 is formed at left and right sides of the channel region on the active layer 130, whereby the active layer 130 is protected by the etch stopper layer 135.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a thin film transistor substrate comprising:
sequentially forming a lower gate electrode of a thin film transistor of an organic light emitting device (OLED) pixel, a gate insulating layer, and an active layer on a substrate;
forming a first contact hole by patterning the gate insulating layer to expose the lower gate electrode;
forming a source/drain electrode layer on the active layer;
forming a source electrode of the thin film transistor of the OLED pixel, a drain electrode of the thin film transistor of the OLED pixel, and a contact portion by patterning the source/drain electrode layer, wherein the contact portion is brought into contact with the lower gate electrode through the first contact hole;
forming a passivation layer on an entire surface of the substrate including the source electrode, drain electrode, and contact portion;
forming a second contact hole by patterning the passivation layer to expose the contact portion; and
forming an upper gate electrode on the passivation layer, wherein the upper gate electrode covers a channel region defined by the source electrode and the drain electrode, and the upper gate electrode is brought into contact with the contact portion through the second contact hole.

2. The method according to claim 1, further comprising forming an etch stopper layer on the active layer before forming the first contact hole.

3. The method according to claim 2, wherein the etch stopper layer is formed on an entire surface of the substrate including the active layer.

4. The method according to claim 1, wherein the contact portion is formed in an island shape, or is formed as a single body with the source electrode or drain electrode of another thin film transistor.

5. The method according to claim 1, further comprising forming an organic light emitting device of the OLED pixel coupled to the thin film transistor.

6. The method according to claim 1, further comprising forming a connection electrode electrically connected to the source electrode of the thin film transistor.

7. The method according to claim 6, wherein the connection electrode is formed in a same layer as the upper gate electrode.

8. The method according to claim 6, further comprising forming a pixel electrode electrically connected to the connection electrode.

9. The method according to claim 6, further comprising forming a color filter over the connection electrode and forming a pixel electrode over the color filter, the pixel electrode electrically connected to the connection electrode.

10. The method according to claim 6, wherein the connection electrode is in direct contact with the source electrode of the thin film transistor.

11. The method according to claim 6, wherein the connection electrode is formed of a same material as that of the upper gate electrode.

12. The method according to claim 6, wherein the connection electrode and the upper gate electrode are formed using a single patterning process.

13. The method according to claim 6, wherein the connection electrode is formed at a predetermined interval from the upper gate electrode on the passivation layer.

14. The method according to claim 1, wherein the first contact hole and the second contact hole are not overlapped with each other.

15. The method according to claim 1, wherein the lower gate electrode and the upper gate electrode are formed of different materials.

16. The method according to claim 1, wherein the upper gate electrode is formed of a material whose transparency is higher than that of the lower gate electrode.

17. The method according to claim 1, wherein the active layer is formed of an oxide semiconductor.

* * * * *